US010130007B2

(12) United States Patent
Chen et al.

(10) Patent No.: US 10,130,007 B2
(45) Date of Patent: Nov. 13, 2018

(54) FAN CONTROL SYSTEM FOR A COMPUTER SYSTEM BASED ON A TIME VARIABLE RATE OF CURRENT

(71) Applicant: International Business Machines Corporation, Armonk, NY (US)

(72) Inventors: Jenseng J S Chen, Taipei (TW); Jung-Tai Chen, Taipei (TW); Tsung-Yu Chen, Taipei (TW); Edward Yu-Chen Kung, Taipei (TW); Tzongli Lin, Taipei (TW); Bruce A. Smith, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 535 days.

(21) Appl. No.: 14/748,573

(22) Filed: Jun. 24, 2015

(65) Prior Publication Data

US 2015/0378403 A1    Dec. 31, 2015

(30) Foreign Application Priority Data

Jun. 25, 2014 (TW) .............................. 103121863 A

(51) Int. Cl.
*G05D 7/00* (2006.01)
*G05D 11/00* (2006.01)
*H05K 7/20* (2006.01)
*G06F 1/20* (2006.01)
*G05B 15/02* (2006.01)

(52) U.S. Cl.
CPC ......... *H05K 7/20209* (2013.01); *G05B 15/02* (2013.01); *G06F 1/206* (2013.01); *Y02D 10/16* (2018.01)

(58) Field of Classification Search
CPC ................................ G05B 15/02; G06F 1/206
USPC ......................................................... 700/282
See application file for complete search history.

(56) References Cited

U.S. PATENT DOCUMENTS

| 7,502,952 | B2 | 5/2009 | Chotoku et al. | |
|---|---|---|---|---|
| 8,093,854 | B2 | 1/2012 | Wang | |
| 8,489,250 | B2 | 7/2013 | Aklilu et al. | |
| 2007/0098374 | A1* | 5/2007 | Fujiwara | G06F 1/203 388/811 |
| 2007/0252544 | A1* | 11/2007 | Chotoku | G06F 1/206 318/268 |
| 2011/0077796 | A1* | 3/2011 | Aklilu | G05D 23/1917 700/300 |
| 2012/0065808 | A1 | 3/2012 | Liu et al. | |
| 2013/0073096 | A1* | 3/2013 | Brey | G05B 13/02 700/282 |

(Continued)

FOREIGN PATENT DOCUMENTS

CN        102694492     9/2012
CN        103631348     3/2014

*Primary Examiner* — Mohammad Ali
*Assistant Examiner* — Md Azad
(74) *Attorney, Agent, or Firm* — Lieberman & Brandsdorfer, LLC

(57) ABSTRACT

A fan control system includes a fan and a target device. The fan control system includes a controller to control the rotation speed of the fan. The controller controls the rotation speed according to a time-variable rate of current consumed by the target device. Particularly, when the time-variable rate of current exceeds a threshold, the controller controls the fan to operate at a maximum rotation speed.

9 Claims, 2 Drawing Sheets

(56) References Cited

U.S. PATENT DOCUMENTS

| | | | |
|---|---|---|---|
| 2013/0099712 A1* | 4/2013 | Chiu | F04D 27/004 318/452 |
| 2014/0054024 A1* | 2/2014 | Chen | H05K 7/20836 165/247 |
| 2015/0050121 A1* | 2/2015 | Wu | F04D 27/004 415/1 |

* cited by examiner

FAN CONTROL SYSTEM FOR A COMPUTER SYSTEM BASED ON A TIME VARIABLE RATE OF CURRENT

CROSS-REFERENCE TO RELATED APPLICATION(S)

This application is based on and claims the benefit of priority from Taiwan Patent Application 103121863, filed on Jun. 25, 2014, the entire contents of which are herein incorporated by reference.

BACKGROUND OF THE INVENTION

Field of the Invention

The present invention relates to a fan control system for a computer system, and particularly relates to the control of the fan rotation speed.

Description of the Prior Art

Generally, a computer system, for example a personal computer or high-end server, will install a cooling fan inside the system for heat dissipation. Particularly, for the existed central processing unit (CPU) or storage device, such as memory or hard disk, due to the increased processing speed and correspondingly the resulted high temperature, it is further required for employing a cooling fan to enhance the effect of heat dissipation to prevent the system damage due to being overheated.

Most of the prior art systems employ a thermal diode, or DTS (Digital thermal Sensor), or PECI (Platform Environment Control Interface) provided by Intel Corp. to monitor the temperature of a device (such as CPU) and to further control the cooling fan. When the temperature of the device is high, it will control the fan to provide more airflow. For example, there are the Q-Fan Technology® provided by ASUSTeK Computer Inc., or Precision Cooling Technology®, and QST (Quiet System Technology®) provided by Intel Corp., in which PECI employs the on-die DTS to provide the digital information regarding the temperature of a processor. QST uses the PECI reading outputted by a CPU as feedback to control the fan to make the temperature from a sensor approaching a control value.

For further information about cooling fans for use in computer systems, refer to U.S. Pat. No. 8,489,250 issued to the assignee of this patent application, which is herein incorporated by reference.

SUMMARY OF THE INVENTION

A fan control system is provided. The aspects of the embodiments focuses on the situation where the rotation speed of a fan is adjusted according to a variation in the current consumption of a target device (such as a CPU), for example, according to the acceleration or deceleration of current consumption.

In one aspect, a fan control system is provided. The system is configured with a computer system including a fan and at least one target device. The fan control system is provided in communication with the fan. More specifically, the control system includes a controller to control a rotation speed of the fan. The controller functions to adjusts the rotation speed of the fan according to a time-variable rate of current consumed by the at least a target device.

These and other features and advantages and similar expressions disclosed in this specification do not mean that all the features and advantages realized by the present invention should be within any single embodiment of the present invention. It should be noted that the expressions regarding to the features and advantages indicate those specific features, advantages or characteristics described in connection with embodiments are included in at least one embodiment of the present invention. Therefore, the descriptions regarding to the features, advantages and similar expressions in the specification are related to the similar embodiments, but not necessarily.

These features and advantages can be further understood by referring to the description below and attached claims or using the Detailed Description of the present invention described below.

BRIEF DESCRIPTION OF THE DRAWINGS

In order to understand the advantages of the present invention, please refer to the specific embodiments shown in the drawings, which describe in details the present invention in a brief description above. It should be noted that these drawings only describe the typical embodiments of the present invention, and should not be considered to limit the scope of the present invention. The present invention is described by referring the drawings and additional specifics and details, in which.

DETAILED DESCRIPTION OF THE EMBODIMENTS

Figure 1:
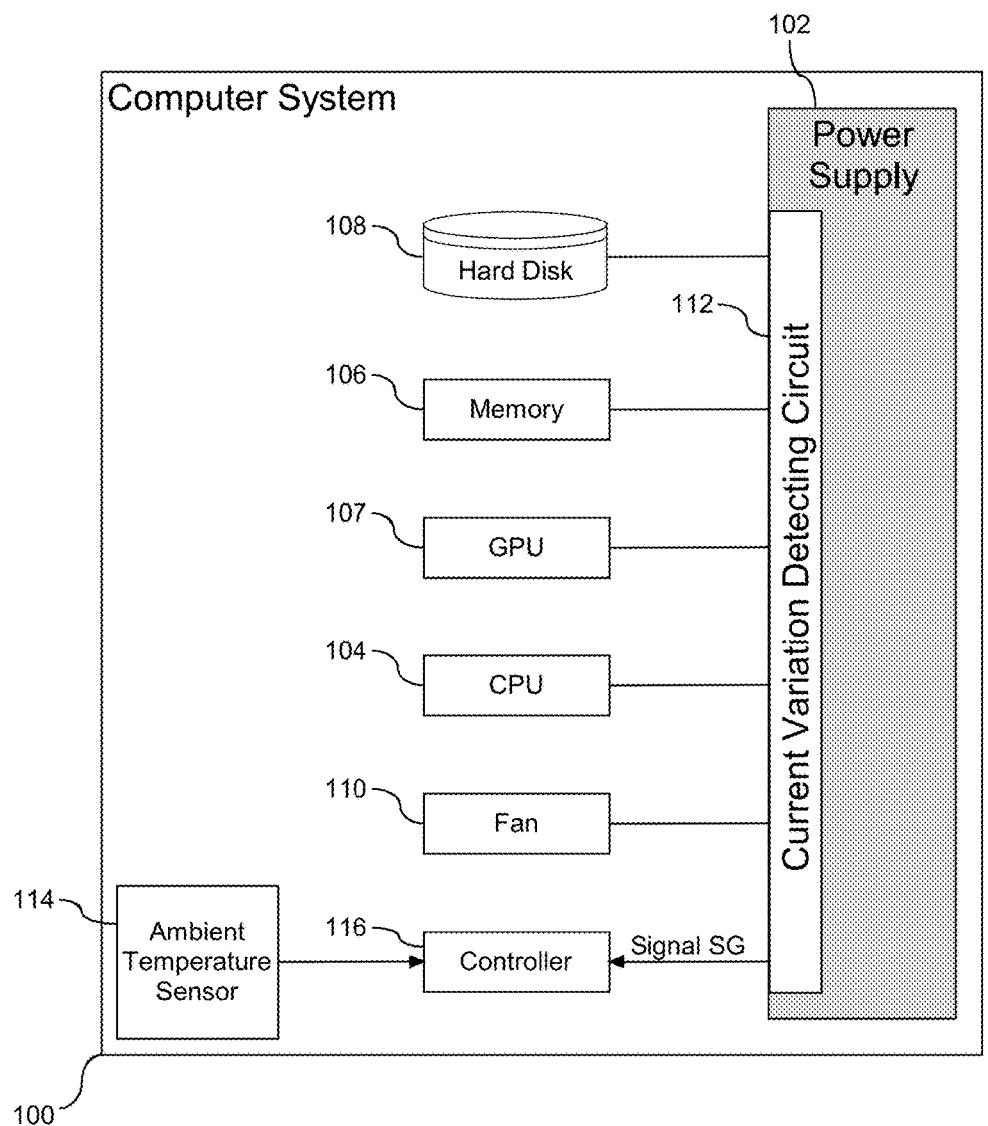
FIG. 1 shows a computer system according an embodiment of the present invention.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

As will be appreciated by one skilled in the art, the present invention may be embodied as a computer system/device, a method or a computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer or server may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium on a hardware storage device that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 2:
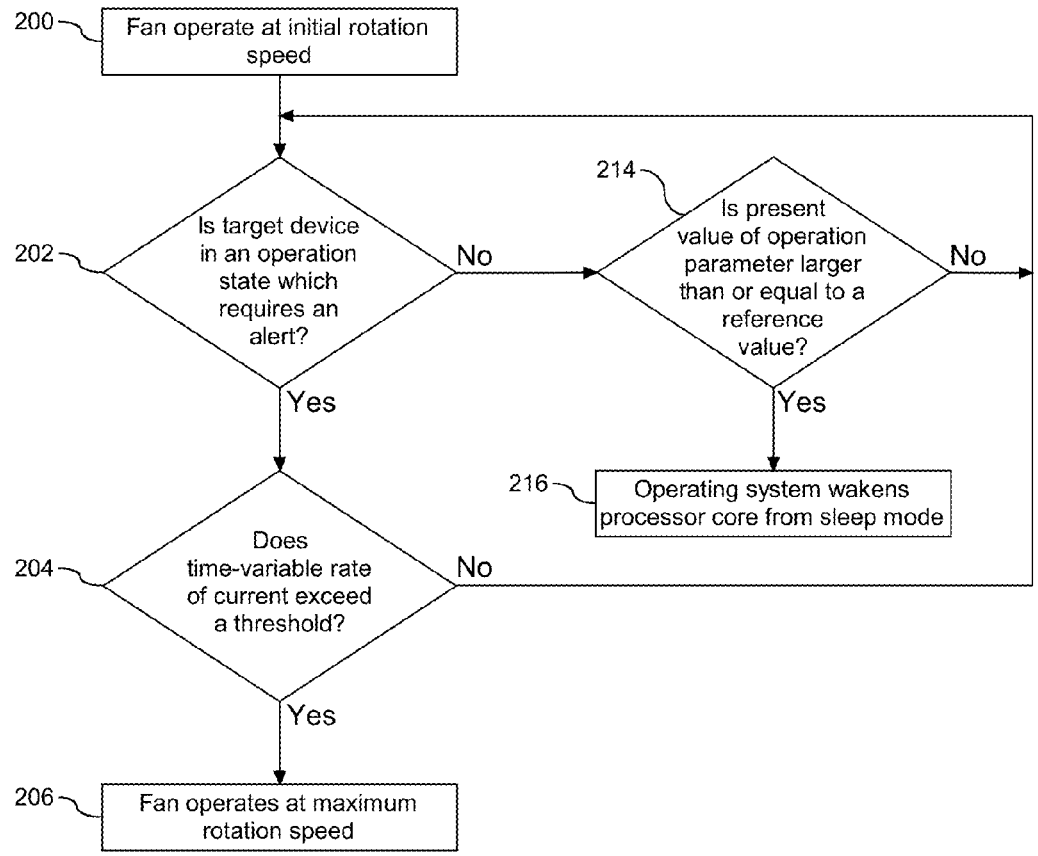
FIG. 2 shows a method flow chart according to an embodiment of the present invention.
Figure 3:
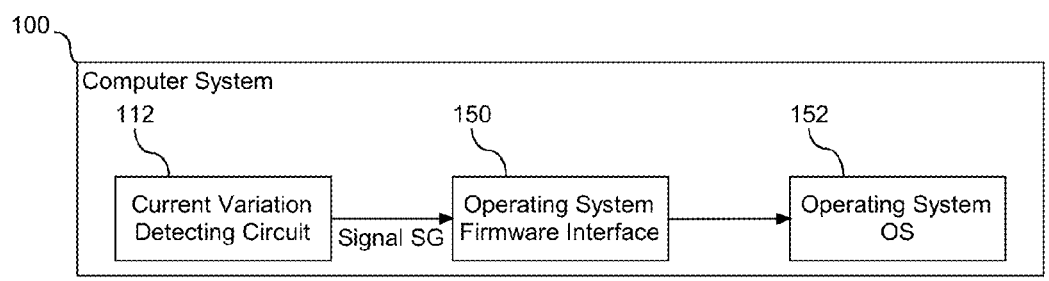
FIG. 3 shows a method flow chart according to another embodiment of the present invention.

Referring now to FIG. 1 through FIG. 3, systems/devices, methods, and computer program products are illustrated as structural or functional block diagrams or process flowcharts according to various embodiments of the present invention. The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

<System Framework>

FIG. 1 shows hardware architecture of a computer system (100) in an embodiment, which comprises a power supply (102), a CPU (104), a memory (106), a graphics processing unit (GPU) (107), a hard disk (108), a fan (110), a power sensor (112), also referred to herein as a current variation detecting circuit, an ambient temperature sensor (114), and a controller (116). Other basic architectures and components for computer system (100) may be referred to an ordinary personal computer or server, such as System X®, Blade Center® or eServer® server from IBM Corp. The details not related to the present invention will be omitted without description.

When the computer system (100) is operating, the power supply (102) is mainly providing DC power to the CPU (104), memory (106), the hard disk (108), and the fan (110). It should be noted that the memory (106), the hard disk (108) and the fan (110) could be called target devices in the specification, because they will generate a large amount of heat during operating. The purpose of the fan (110) is to cool down these target devices. In an embodiment shown in FIG. 1, only the CPU (104) has the fan (110). But, in other embodiments not shown, the CPU (104), the memory (106), the GPU (107), and the hard disk (108) may have their individual corresponding fan to enhance the efficiency of heat dissipation. In order to clearly describe the present invention, only the CPU (104) and a single fan (110) are used in the description. However, the skilled in the art may replace the CPU (104) with the memory (106), the GPU (107), the hard disk (108), or any other target device, which may generate heat and need to be cooled in the computer system.

Preferably, the fan (110) is a so-called "smart fan", which has a microprocessor (not shown) to drive or manage the operation of the fan (110). For example, the microprocessor of the fan (110) can receive Pulse Width Modulation (PWM)

signals and control the speed of the fan (110) according to the duty cycle in PWM signals.

The current variation detecting circuit (112) is coupled to a power supply (102) of a target device and adapted to detect the time-variable rate of current consumed jointly by multiple target devices or current consumed by a specific target device (i.e., a variation in current in unit time). Preferably, the current variation detecting circuit (112) comprises a differentiator based on an operation amplifier (such as LM 232 or LM 375) and coupled to a hot plug controller (not shown) or an overcurrent protection component (not shown) of the power supply (102). One of the advantages of the differentiator based on the operation amplifier (such as LM 232 or LM 375) is that its response time is short enough, say milliseconds, to instantly respond to a variation in current. In another embodiment, the current variation detecting circuit (112) is dispensed with, and information pertaining to current variations is provided by the target device (for example, a CPU (104) with a built-in current variation detection module). The rotation speed of the fan (110) is adjusted according to a variation in the current consumption of a target device such as a CPU, for example, according to acceleration and deceleration of the current consumption.

The controller (116) comprises a microprocessor and memory (not shown), preferably integrated in BMC (Baseboard Management Controller) on a motherboard (not shown) of the computer system (100), such as VSC 452 BMC provided by Maxim Corp. or SE-SM4210-P01 BMC provided by ServerEngines Corp. It should be noted that the controller (116) may also be implemented as an independent controller.

The controller (116) can have one or more signal ports for outputting control signals to the fan (110) so as to control the operation of the fan (110) or to set the configuration of the fan (110). For example, the controller (116) can output PWM signals with different duty cycles to the microprocessor of the fan (110) as the rotating speed control signal to control the rotating speed of the fan (110).

The controller (116) has other signal ports (not shown) for receiving a signal SG sent from the current variation detecting circuit (112) to indicate the current time-variable rate. Preferably, the indicative signal sent from the current variation detecting circuit (112) is provided in the form of an interrupt signal to the controller (116), and the controller (116) takes a corresponding action immediately according to the indicative signal.

The controller (116) can also access the target device's operation state information, for example, a power state (PS) mode defined by Intel with a view to carrying out voltage regulation (VR) of a CPU, various operation parameters related to a CPU and attributed to PECI (Platform Environment Control Interface) reading, or operation parameters related to a memory and attributed to TSOD (Thermal Sensor on dual in-line memory module (DIMM) reading, but the present invention is not limited thereto. According to the prior art, specific operation state information (for example, Intel's PS mode) pertaining to some target devices is not provided for use by a baseboard management controller; hence, in some situations, the controller (116) has to operate in conjunction with a specific additional communication channel in order to access the operation state information.

For further information about a basic way of controlling a fan (110) by the controller (116) in an embodiment of the present invention, refer to Intel's Server Management on Intel® Server Boards and Intel® Server Platforms or US Pub. 20130084181, which discloses that a baseboard management controller uses a fan speed control table (FSC table) to control the rotation speed of a fan. The differences between the controller (116) and its conventional counterparts are described below.

A fan configuration and control method according to embodiments of the present invention are described below in conjunction with the schematic view of FIG. 1 and the flowchart of FIG. 2.

<Fan Control Process Flow>

Step (200): the computer system (100) powers up, and the controller (116) drives the fan (110) to operate at a predetermined initial rotation speed (such as 1000 rpm).

Step (202): the controller (116) determines whether the operation state of a target device (such as the CPU (104)) requires a critical alert, for example, high load or high temperature. In an embodiment, the controller (116) identifies a PS mode of the processor (104) and determines whether the PS mode value is "PS0". A PS mode value of "PS0" indicates that the CPU (104) is consuming much current and thus is in a high load state. By contrast, a PS mode value of "PS1", "PS2", or "PS3" indicates that the CPU (104) is not in a high load state and thus does not require a critical alert. Step (202) will be followed by step (204) if the determination in step (202) is affirmative. Step (202) will be followed by step (214) if the determination in step (202) is negative.

Step (204): the controller (116) receives the signal SG sent from the current variation detecting circuit (112) and adapted to indicate the current time-variable rate, and then the controller (116) determines whether the time-variable rate of current consumed by the CPU (104) is larger than a first predetermined value according to the signal SG. Step (204) will be followed by step (206) if the determination in step (204) is affirmative. Step (204) will be followed by step (202) if the determination in step (204) is negative. The first predetermined value is available in a conventional look-up table and depends on the model number of the computer system (100), or the model number and quantity of the target devices. In this step, the signal SG indicative of the time-variable rate of current is directed to either a variation in the current of a single target device or a variation in the sum of the currents of multiple target devices (such as the CPU (104) and a memory (106)).

Step (206): the controller (116) controllably drives the fan to operate at a maximum rotation speed. An affirmative determination in step (204) indicates that the CPU (104) has already operated in a high-load state initially (step (202)) and is further confronted with a surge of workload; hence, in this step, the controller (116) decides to increase the rotation speed of the fan, for example, from 1000 rpm to 3000 rpm, so as to speed up heat dissipation. Preferably, to ensure that the CPU (104) can deal with the surge of workload efficiently, the controller (116) controllably drives the fan to operate at a maximum rotation speed, for example, by increasing the rotation speed from 1000 rpm to a maximum rotation speed of 4000 rpm, albeit at the cost of increasing the power consumption or increasing the noise generated from the fan.

Step (214): determining whether the present value of an operation parameter larger than or equal to a reference value. A negative determination in step (202) is indicative of a PS mode value of "PS1", "PS2", or "PS3" and thus indicates that the CPU (104) is not presently in an operation state which requires a critical alert, and in consequence a surge of workload is unlikely to cause overheating, thereby rendering it practicable to deal with a surge of workload flexibly. Like step (204), step (214) entails sending the signal SG from the current variation detecting circuit (112) to indicate the current time-variable rate. In particular, this embodiment, step (214) differs from step (204) in that, as shown in FIG. 3, the current variation detecting circuit (112) sends the signal SG to an operating system firmware interface (150) through a southbridge chip (not shown), and then the operating system firmware interface (150) provides the signal SG to the operating system OS (152). The operating system firmware interface (150) comprises BIOS (Basic Input/Output System), UEFI (Universal Extensible Firmware Interface), or EFI (Extensible Firmware Interface). Hence, the operating system OS determines whether the time-variable rate of current consumed by the CPU (104) is larger than a second predetermined value according to the signal SG. Step (214) will be followed by step (216) if the determination in step (214) is affirmative. Step (214) will be followed by step (202) if the determination in step (214) is negative. The second predetermined value is available in a conventional table and depends on the model number of the computer system (100) or the model number and quantity of the target devices. In this step, the signal SG indicative of the time-variable rate of current is directed to either a variation in the current of a single target device or a variation in the sum of the currents of multiple target devices (such as the CPU (104) and the memory (106)).

Step (216): the operating system OS waken processor core from sleep mode. An affirmative determination in step (214) indicates that the CPU (104) is not in a high-load state initially (step (202)) but is presently confronted with a surge of workload. Hence, in this step, the CPU (104) is a multi-core processor, and any core of the CPU (104) will be wakened by the operating system OS if the core is found to be in a sleep mode, so as to deal with the surge of workload. Understandably, for the same reason, the operating system OS is also capable of performing any other related operations, for example, suspending the execution of unimportant programs, such as resource-intensive animated screensaver programs, so as to enhance processing efficiency, but the present invention is not limited thereto.

For instance, if a circuit component detects that the current consumption of a target device increases quickly during a short period of time, say, a second, it will infer that the workload of the computer system has surged and thus consumed more power. To prevent the computer system from accumulating excessive heat within a short period of time and thus damaging the hardware or undergoing throttling, it is practicable to take proactive measures, including instructing the fan to operate at the maximum rotation speed and thereby effectuate optimal cooling, so as to ensure that the computer system can execute specified tasks smoothly, albeit at the cost of increasing the power consumption or increasing the noise generated from the fan.

By contrast, plenty of conventional fan controlling methods give priority to saving power or preventing noise but ignore the need to ensure that a computer system can execute tasks smoothly or most quickly in case of a surge of workload.

Furthermore, a conventional IPMI (Intelligent Platform Management Interface) detects the temperature of a system by a temperature sensor or detects the present operating status of the system by a sensor of another system, so as to enable a baseboard management controller (BMC) to perform specific computation for controlling the rotation speed of a fan. However, the conventional IPMI has a drawback explained below. Due to its heavy workload, the BMC polls a sensor only at specific intervals, usually 20 seconds, for a detected temperature or the other parameter values. However, in case of a surge of workload, heat accumulated inside the system in seconds will be so much as to catch conventional fan controlling methods off guard.

In view of this, a circuit dedicated to detecting a time-variable rate of current consumed by a target device is provided, especially by means of hardware components, so as to detect current variations quickly, adjust the rotation speed of the fan instantly, and thus overcome the drawback the prior art—the response time is so short as to damage the hardware or necessitate throttling.

According to an embodiment, a fan control system for use in a computer system is provided. The computer system comprises a fan and a target device. The fan control system comprises a controller for controlling a rotation speed of the fan, wherein the controller adjusts the rotation speed of the fan according to a time-variable rate of current consumed by the at least a target device. In particular, the controller controllably drives the fan to operate at a maximum rotation speed when the time-variable rate exceeds a predetermined value.

According to another embodiment, a method of controlling a fan is for use in the aforesaid fan control system. The method comprises driving controllably by a controller the fan to operate at a first rotation speed; and driving controllably by the controller the fan to operate at a second rotation speed in response to variation of the time-variable rate.

The foregoing preferred embodiments are provided to illustrate and disclose the technical features of the present invention, and are not intended to be restrictive of the scope of the present invention. Hence, all equivalent variations or modifications made to the foregoing embodiments without departing from the spirit embodied in the disclosure of the present invention should fall within the scope of the present invention as set forth in the appended claims.

What is claimed is:

1. A fan control system comprising:
   a computer system including a fan and at least one target device;
   a fan control system in communication with the fan, the control system comprising a controller to control a rotation speed of the fan, wherein the controller adjusts the rotation speed of the fan according to a time-variable rate of current consumed by the target device and an operation state of the target device; and
   a detecting circuit connected to the target device and adapted to detect the time-variable rate of current and send an indicative signal to the controller in response to the time-variable rate of current detected,
   wherein the computer system further comprises an operating system, and the detecting circuit provides the indicative signal to the operating system,
     wherein the controller controllably drives the fan to operate at a maximum rotation speed when the operation state is a first predetermined state and the time-variable rate of current exceeds a first predetermined value; and
     wherein the operating system executes a predetermined operation when the operation state is a second predetermined state and the time-variable rate of current exceeds a second predetermined value; and
   wherein the first predetermined state comprises a first power state (PS) mode at least partially defined with a first current consumed by the target device and at least one second PS mode at least partially defined with at least one second current consumed by the target device, wherein the first current is greater than the second current.

2. The system of claim 1, wherein the target device includes at least two heterogeneous target devices.

3. The system of claim 1, wherein the indicative signal is provided in form of an interrupt signal to the controller.

4. The system of claim 1, wherein the detecting circuit comprises a differentiator based on an operation amplifier.

5. The system of claim 4, wherein the differentiator detects the time-variable rate of current.

6. The system of claim 1, further comprising the controller to controllably drive the fan with a Pulse Width Modulation (PWM) signal.

7. The system of claim 6, further comprising the controller to controllably drive the fan with PWM signals of different duty cycles.

8. The system of claim 1, wherein the first PS mode defines the first predetermined value as a threshold value for the time-variable rate of current, the threshold variable associated with driving the fan to operate at a maximum rotation speed, and the second PS mode defines the second predetermined value as a reference value for the time-variable rate of current, the reference value associated with the predetermined operation of waking at least one core of a multi-core processor to absorb at least a portion of an increase in the second current.

9. The fan control system of claim 1, further comprising the controller to determine a surge of current consumption and mitigate heat accumulation and associated decrease in service life of at least a portion of the computer system.

* * * * *